United States Patent [19]

Kousaka et al.

[11] Patent Number: 4,808,852

[45] Date of Patent: Feb. 28, 1989

[54] INPUT CIRCUIT HAVING LEVEL SHIFT

[75] Inventors: Kunimitsu Kousaka, Kawasaki; Kunihiko Gotoh, Kunitachi, both of Japan

[73] Assignee: Fujitsu Limited, Kawasaki, Japan

[21] Appl. No.: 127,567

[22] Filed: Dec. 2, 1987

Related U.S. Application Data

[63] Continuation of Ser. No. 836,060, Mar. 4, 1986.

[30] Foreign Application Priority Data

Mar. 6, 1985 [JP] Japan ................ 60-042708

[51] Int. Cl.[4] ............... H03K 19/094; H03K 19/017; H03K 5/153
[52] U.S. Cl. .................... 307/451; 307/448; 307/475; 307/363; 307/579
[58] Field of Search ............ 307/200 B, 443, 448, 307/475, 264, 363, 577, 579, 584–585

[56] References Cited

U.S. PATENT DOCUMENTS 4,543,494  9/1985  Wakimoto .................. 307/200 B

FOREIGN PATENT DOCUMENTS 0179025  10/1983  Japan .......................... 307/448
0117328   7/1984  Japan .......................... 307/475

*Primary Examiner*—John S. Heyman
*Assistant Examiner*—M. R. Wambach
*Attorney, Agent, or Firm*—Staas & Halsey

[57] ABSTRACT

A semiconductor integrated circuit including; an inverter circuit including a pair of transistors of different conductivities and a level shift circuit, one transistor being supplied with an input signal via the level shift circuit, the other transistor being supplied with the input signal directly, and the level shift circuit having an amount of level shift such that, when an input signal of a transition level for distinguishing a logic level in the inverter circuit is received, the level of the input signal via the level shift circuit is shifted near to the threshold level of the other transistor.

4 Claims, 2 Drawing Sheets

INPUT CIRCUIT HAVING LEVEL SHIFT

This is a continuation of co-pending application Ser. No. 836,060 filed on Mar. 4, 1986.

BACKGROUND OF THE INVENTION

1. Field of the Invention

The present invention relates to a semiconductor integrated circuit. Particularly, the present invention is directed to a semiconductor integrated circuit provided with an input circuit device which can detect a level of an input signal having a range narrower than the power supply voltage.

2. Description of the Related Art

In a semiconductor integrated circuit, an input signal having an input level having a range narrower than the power supply voltage of the circuit (for example, when the power supply voltage is 10 V, the input signal has a level of 5 V) is often applied to its input circuit.

In some cases, the semiconductor integrated circuit will have a power supply voltage of a predetermined value (for example, 10 V), and the output signal of a prior art semiconductor integrated circuit having a power supply source lower in value (for example, 5 V) will be input thereto. In other cases, the semiconductor integrated circuit may be a special one (for example, a metal-oxide semiconductor (MOS) circuit) and the output signal of a prior art semiconductor integrated circuit (for example, a transistor-transistor logic (TTL) with a different logic amplitude will be input thereto. In such cases, the latter semiconductor integrated circuit recieves an input signal with an input level having a range narrower than the power supply voltage, as mentioned above.

The input circuit of such a semiconductor integrated circuit can consist of an inverter circuit including a pair of transistors. That is, the inverter includes a P channel transistor and N channel transistor, each having a gate connected to an input terminal.

In such an input circuit, as explained in detail hereinafter, both the P channel transistor and N channel transistor in the input circuit may be ON at the same time, resulting in consumption of a large amount of power, and reducing the inverting speed. Further, there is the problem of only the N channel transistor being switched on and off along with variations in the input signal, whereupon the output obtained from the output terminal OUT becomes insufficient to perform a level change operation.

SUMMARY OF THE INVENTION

An object of the present invention is to provide a semiconductor integrated circuit which can solve the above-mentioned problems of conventional circuits.

Another object of the present invention is to provide a semiconductor integrated circuit having an input circuit which can precisely detect the level change in the input level of an input signal having a range narrower than the power supply source, and which operates stably and at a high speed without consuming excess power.

For the purpose of solving the problems mentioned above, according to the present invention, there is provided a semiconductor integrated circuit including an inverter circuit including a pair of transistors of different conductivities and a level shift circuit. One transistor is supplied with an input signal via the level shift circuit, the other transistor is supplied with the input signal directly. The level shift circuit provides a level shift such that, when an input signal having a transition level for distinguishing a logic level in the inverter circuit is received, the level of the input signal via the level shift circuit is shifted close to the threshold level of the other transistor.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
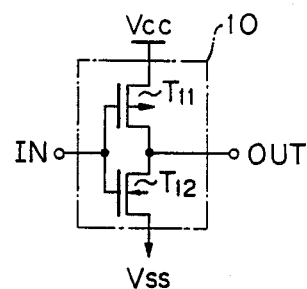
FIG. 1 is a circuit diagram of an input circuit in a conventional semiconductor integrated circuit.

FIG. 1 is one example of a conventional circuit. The circuit shown in FIG. 1 uses an inverter circuit 10 including a pair of transistors (P channel transistor $T_{11}$ and N channel transistor $T_{12}$) each having a gate connected to a common input terminal.

Assume that the power supply voltage $V_{CC}$ of the input circuit is 10 V and the input signal at the input terminal IN has a high level of 5 V and low level of 0 V. In such a case, if the input signal at the input terminal IN is low level, the P channel transistor $T_{11}$ turns on and the N channel transistor $T_{12}$ turns off. On the other hand, if the input signal at the input terminal IN is high level, while the N channel transistor $T_{12}$ turns on, the P channel transistor $T_{11}$ may not turn off depending on its threshold value since the potential of the gate connected to the input terminal IN remains negative with respect to the source connected to the power supply $V_{CC}$ (in this example, the potential of the gate is $-5$ V). This is due to the fact that the high level of the input signal is lower than the power supply voltage, so that the value of the high level does not exceed the threshold value $V_{THP}$ of the P channel transistor $T_{11}$. This results in the problems described previously.

Figure 2:
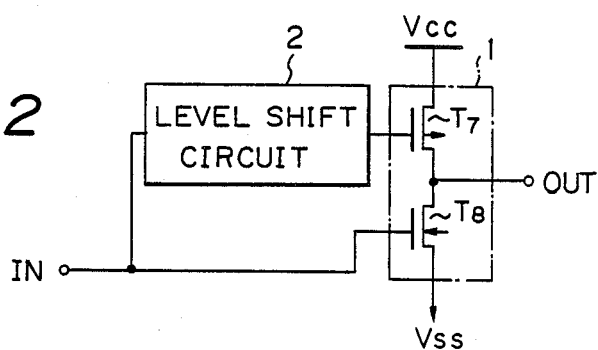
FIG. 2 is a circuit diagram of a basic input circuit in a semiconductor integrated circuit according to the present invention.

FIG. 2 is a basic input circuit in a semiconductor integrated circuit of the present invention. In FIG. 2, 1 is an inverter formed by a pair of transistors (P channel transistor $T_7$ and N channel transistor $T_8$). An input signal from an input terminal IN is level shifted by a predetermined amount via a level shift circuit 2 and is supplied to a gate of the P channel transistor $T_7$. On the other hand, the input signal is supplied directly from the input terminal IN to a gate of the N channel transistor 8.

The level shift circuit 2 is constructed so that when the inverter 1 receives an input signal having a level corresponding to the transition portion of two logic levels, by which the inverter 1 discriminates a high level and low level, the transition level is level shifted to close to that of the threshold value of the P channel transistor $T_7$. Even if the level of the input signal is narrower in range than the power supply voltage of the integrated circuit (for example, when the power supply voltage of the integrated circuit is 10 V, the level of the input signal is only 5 V), the pair of transistors $T_7$ and $T_8$ can be reliably turned ON and OFF in accordance with the level change (that is, the change between 0 V for the low level and 5 V for the high level).

That is, when the input level of the input signal at the input terminal IN is low, the P channel transistor $T_7$ turns ON and the N channel transistor $T_8$ turns OFF. On the other hand, when the input level of the input signal at the input terminal IN is high, even if the level of the input signal is lower than the power supply voltage of the integrated circuit, as the level of the input signal is shifted (raised) by a predetermined amount via the level shift circuit 2 and input to the P channel transistor $T_7$ (that is, shifted until it exceeds the level of the threshold value of the P channel transistor $T_7$ to be input to the P channel transistor $T_7$), the P channel transistor $T_7$ reliably turns OFF and only the N channel transistor $T_8$ is ON. Therefor, the two transistors are never ON together, unlike the conventional example mentioned above, so the input circuit does not consume excess power and can operate rapidly and stably.

Figure 3:
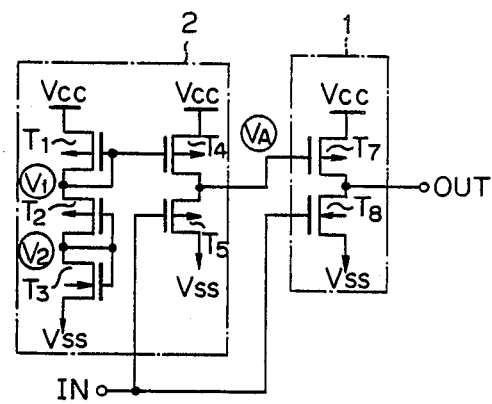
FIG. 3 is a detailed circuit diagram of the input circuit of one embodiment of the semiconductor integrated circuit according to the present invention.

FIG. 3 is a detailed circuit diagram of the input circuit of one embodiment of the semiconductor integrated circuit of the present invention, wherein the level shift circuit 2 shown in FIG. 2 is formed by transistors $T_1$ to $T_5$.

Here, transistors $T_4$ and $T_5$ are P channel transistors. A gate of the transistor $T_5$ is input directly to the inverter 1 along with the input signal from the input terminal IN. A gate of the transistor $T_4$ is supplied with the potential $V_1$ from the connecting point of the transistors $T_1$ and $T_2$ in a level divider circuit (bias circuit) formed by the transistors $T_1$, $T_2$, and $T_3$.

Figure 4:
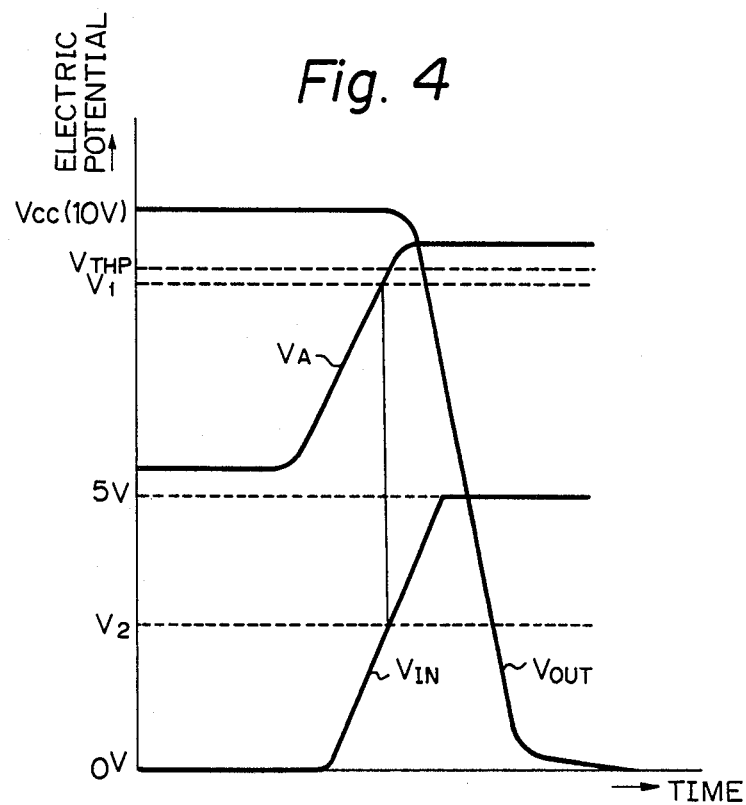
FIG. 4 is a diagram of electric potentials at various points in the circuit shown in FIG. 3, when the input signal is input thereto.

Here, the transistors $T_1$, $T_2$, and $T_3$ divide the level of the power supply voltage $V_{CC}$ and supply a predetermined bias voltage $V_1$ to the transistor $T_4$. They form a constant current source together with the transistor $T_4$. As shown in FIG. 4, the electric potential $V_1$ at the connection point of the transistors $T_1$ and $T_2$ is set at the level near the threshold level $V_{THP}$ of the P channel transistor $T_7$ ($V_{THP}$ in FIG. 4), and the electric potential $V_2$ at the connection point of the transistors $T_2$ and $T_3$ is set at the transition level mentioned above (that is, the level corresponding to the level at the transition portion where the input signal $V_{IN}$, the logic level of which is discriminated by the inverter, is changed from low to high).

Further, as mentioned above, the transistor $T_4$, having a gate where the predetermined bias voltage $V_1$ is supplied so as to form the constant current source, and the transistor $T_5$, having a gate where the input signal is supplied from the input terminal IN, form a so-called source follower circuit. The electric potential $V_A$ at the source side of the transistor $T_5$ is raised (level shifted) by the predetermined amount from the gate electric potential (which is the level of the input signal).

FIG. 4 shows the change in the electric potential $V_A$ (that is, the electric potential $V_A$ applied to the gate of the P channel transistor $T_7$) when, in the circuit shown in FIG. 3, the level $V_{IN}$ of the input signal is changed from low (0 V) to high (5 V). Further, as already mentioned, the potential $V_1$ (supplied to the gate of the transistor $T_4$) at the connection point between the transistors $T_1$ and $T_2$ is set at the electric potential near the threshold value $V_{THP}$ of the P channel transistor $T_7$, and the electric potential $V_2$ at the connection point between the transistors $T_2$ and $T_3$ is set at the level of the input signal which becomes the transition level mentioned above for the inverter circuit 1.

The amount by which the electric potential $V_A$ at the source side of the transistor $T_5$ is shifted from its gate electric potential (which is the level $V_{IN}$ of the input signal) is set at the value which the electric potential $V_A$ is raised to the electric potential $V_1$ (that is, the electric potential near the threshold value $V_{THP}$ of the P channel transistor $V_7$) when the level $V_{IN}$ of the input signal is in the transition level $V_2$ as mentioned above. (Refer to FIG. 4).

In this way, when the level of the electric potential of the gate of the P channel transistor $T_7$ is shifted so that the level of the input signal exceeds the transition level $V_2$ (that is, high level) for the inverter circuit, the electric potential $V_A$ immediately exceeds the threshold value $V_{THP}$ of the transistor $T_7$, and the transistor $T_7$ reliably turns OFF. Further, in FIG. 4, $V_{OUT}$ shows a level of the output signal which is output from the output terminal OUT. It is high level (10 V) when the level of the input signal is low level (0 V). When the level of the input signal becomes high level (5 V), the P channel transistor $T_7$ turns OFF. (At this time, the N channel transistor $T_8$ is in the ON state). Therefore, the level of the output signal is reliably made low (0 V).

Figure 5:
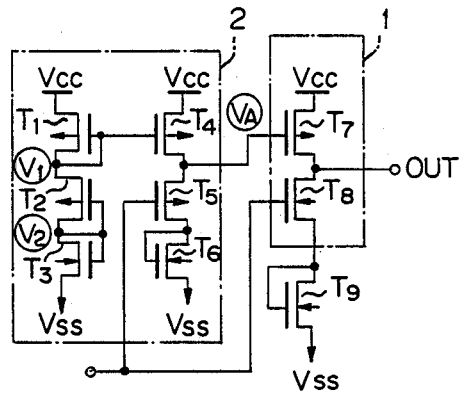
FIG. 5 is a detailed circuit diagram of another embodiment of the semiconductor integrated circuit according to the present invention.

FIG. 5 is a detailed circuit diagram of another embodiment of the input circuit of the semiconductor integrated circuit according to the present invention. In FIG. 5, a transistor $T_6$ is connected in series to the P channel transistor $T_5$ which forms a source follower circuit. Provision of the transistor $T_6$ enables a balance between the transistor $T_6$ and the transistor $T_3$ in the level divider circuit (bias circuit), so the value of the currents which flow in the transistors $T_4$ and $T_5$ can easily be made a predetermined value.

A transistor $T_9$ is also provided and is connected in series with the N channel transistor $T_8$ so that if the low level side of the input signal is higher in level than the threshold value of the N channel transistor $T_8$, the N channel transistor is reliably turned OFF. That is, by providing the transistor $T_9$, the potential at the source side of the N channel transistor $T_8$ is raised from the ground potential by the predetermined level (corresponding to the potential difference of one MOS diode). Then, if the low level of the input signal is a predetermined level higher than 0 V, when the low level input signal is input, the N channel transistor $T_8$ is reliably turned OFF. The transistor $T_8$ is thus prevented from remaining ON, avoiding malfunctions of the circuit during the low level state of the input signal.

According to the present invention, there is provided a semiconductor integrated circuit having an input circuit wherein, even if an input signal having a level with a range narrower than the power supply voltage, the level change can be exactly detected. This ensures that a high speed, stable operation can be carried out without consumption of excess power.

We claim:

1. A semiconductor integrated circuit operatively connected to receive an input signal, comprising:
    an inverter circuit including a pair of first and second transistors having different conductivities; and
    a level shift circuit, operatively connected to directly receive the input signal and operatively connected to said inverter circuit, for level shifting the input signal and supplying the level shifted input signal to said inverter circuit, said first transistor having a gate operatively connected to receive the level shifted input signal from said level shift circuit, having a source connected to a power supply and having a drain, and said second transistor having a gate operatively connected to directly receive the input signal, having a drain connected to said drain of said first transistor and having a source, said level shift circuit performing a level shift operation such that, when the input signal is received and has a transition level for discriminating a logic level in said inverter circuit, the level of said input signal is shifted to approximately a threshold level of said first transistor.

2. A semiconductor integrated circuit according to claim 1, wherein said level shift circuit is a source follower circuit comprising:

a constant current source; and a third transistor, operatively connected to said constant current source, having a gate operatively connected to receive the input signal, having a source operatively connected to said inverter circuit, and having a drain.

3. A semiconductor integrated circuit according to claim 2, wherein said constant current source comprises:

a fourth transistor having a gate, having a source and having a drain, one of said source and drain operatively connected to a power supply and the other one of said source and drain connected in parallel with the gate;

a fifth transistor having a gate, having a source, and having a drain, one of said source and drain operatively connected to said gate of said fourth transistor and to one of said source and drain of said fourth transistor connected in parallel with the gate of said fourth transistor, a first connection node being formed therebetween;

a sixth transistor having a gate operatively connected to said gate of said fifth transistor, having a source and having a drain, one of said source and drain operatively connected to one of said source and drain of said fifth transistor not connected to said gate of said fourth transistor and to said gate of said fifth transistor, a second node being formed therebetween, the other one of said source and drain connected to ground; and a seventh transistor having a gate operatively connected to said gate of said fourth transistor, having a source and having a drain, one of said source and drain operatively connected to the power supply and the other one of said source and drain operatively connected to said gate of said first transistor and to said source of said third transistor, a first potential at said first connection node being set to approximately a threshold level of said first transistor, a second potential at said second connection node being set to a transistion level, and said first potential being input to said gate of said seventh transistor.

4. A semiconductor integrated circuit according to claim 3, further comprising:

an eighth transistor, having one of a source and drain operatively connected to said drain of said third transistor having a gate operatively connected to said drain of said third transistor, and having the other one of said source and drain operatively connected to ground, for allowing currents flowing in said fourth and fifth transistors to be made a predetermined value; and a ninth transistor, having one of a source and drain operatively connected to said source of said second transistor, having a gate operatively connected to said source of said second transistor, and having the other one of said source and drain operatively connected to ground, for raising the potential at said source of said second transistor by a predetermined level.

* * * * *